(12) United States Patent
Nakazaki et al.

(10) Patent No.: US 11,807,837 B2
(45) Date of Patent: Nov. 7, 2023

(54) COMPOSITION, METHOD FOR CLEANING ADHESIVE POLYMER, METHOD FOR PRODUCING DEVICE WAFER, AND METHOD FOR REGENERATING SUPPORT WAFER

(71) Applicant: SHOWA DENKO K.K., Tokyo (JP)

(72) Inventors: Susumu Nakazaki, Tokyo (JP); Kuniaki Miyahara, Tokyo (JP); Tomoyuki Fukuyo, Tokyo (JP)

(73) Assignee: Resonac Corporation, Tokyo (JP)

( * ) Notice: Subject to any disclaimer, the term of this patent is extended or adjusted under 35 U.S.C. 154(b) by 325 days.

(21) Appl. No.: 17/269,692

(22) PCT Filed: Sep. 26, 2019

(86) PCT No.: PCT/JP2019/037993
§ 371 (c)(1),
(2) Date: Feb. 19, 2021

(87) PCT Pub. No.: WO2020/080060
PCT Pub. Date: Apr. 23, 2020

(65) Prior Publication Data
US 2021/0317390 A1 Oct. 14, 2021

(30) Foreign Application Priority Data

Oct. 16, 2018 (JP) ................. 2018-195431

(51) Int. Cl.
| | |
|---|---|
| *C11D 7/50* | (2006.01) |
| *C11D 7/32* | (2006.01) |
| *C11D 11/00* | (2006.01) |
| *H01L 21/02* | (2006.01) |

(52) U.S. Cl.
CPC .......... *C11D 7/3209* (2013.01); *C11D 7/5013* (2013.01); *C11D 7/5022* (2013.01); *C11D 11/0047* (2013.01); *H01L 21/02057* (2013.01)

(58) Field of Classification Search
CPC .................................................. C11D 11/0047
(Continued)

(56) References Cited

U.S. PATENT DOCUMENTS 6,652,665 B1  11/2003  Sachdev et al.
6,818,608 B2  11/2004  Moore
(Continued)

FOREIGN PATENT DOCUMENTS

CN  107034028 A  8/2017
JP  2004-969 A   1/2004
(Continued)

OTHER PUBLICATIONS

Bing Xu et al., "Making Honeycomb Microcomposites by Soft Lithography", Advanced Materials, 1999, pp. 492-495, vol. 11, No. 6.
(Continued)

*Primary Examiner* — Gregory E Webb
(74) *Attorney, Agent, or Firm* — Sughrue Mion, PLLC

(57) ABSTRACT

Provided is a composition having high affinity for the surface of an adhesive, and excellent long-term storage stability. This composition comprises: a quaternary alkylammonium fluoride or a hydrate of a quaternary alkylammonium fluoride; and an aprotic solvent, wherein the aprotic solvent includes (A) an N-substituted amide compound having 4 or more carbon atoms and not containing active hydrogen on a nitrogen atom, and (B) an ether compound.

19 Claims, 2 Drawing Sheets

(58) Field of Classification Search
USPC .......................................................... 510/175
See application file for complete search history.

(56) References Cited

U.S. PATENT DOCUMENTS

| | | |
|---|---|---|
| 2005/0119143 A1* | 6/2005 | Egbe .................... C11D 7/3218 |
| | | 510/175 |
| 2014/0213039 A1 | 7/2014 | Lee et al. |
| 2015/0152366 A1 | 6/2015 | Shimada et al. |
| 2017/0158888 A1 | 6/2017 | Kang et al. |

FOREIGN PATENT DOCUMENTS

| | | |
|---|---|---|
| JP | 2014-146793 A | 8/2014 |
| KR | 10-2016-0039944 A | 4/2016 |
| KR | 10-2016-0087089 A | 7/2016 |
| TW | 201406949 A | 2/2014 |

OTHER PUBLICATIONS

Shuichi Takayama et al., "Topographical Micropatterning of Poly(dimethylsiloxane) Using Laminar Flows of Liquids in Capillaries", Advanced Materials, Apr. 18, 2001, pp. 570-574, vol. 13, No. 8.

Maya Kleiman et al., "Determination of Factors Influencing the Wet Etching of Polydimethylsiloxane Using Tetra-n-butylammonium Fluoride", Macromolecular Chemistry and Physics, 2016, pp. 284-291, vol. 217.

International Search Report for PCT/JP2019/037993 dated Jan. 7, 2019 (PCT/ISA/210).

\* cited by examiner

COMPOSITION, METHOD FOR CLEANING ADHESIVE POLYMER, METHOD FOR PRODUCING DEVICE WAFER, AND METHOD FOR REGENERATING SUPPORT WAFER

CROSS REFERENCE TO RELATED APPLICATIONS

This application is a National Stage of International Application No. PCT/JP2019/037993 filed Sep. 26, 2019, claiming priority based on Japanese Patent Application No. 2018-195431 filed Oct. 16, 2018.

FIELD

The present disclosure relates to a composition, a method for cleaning an adhesive polymer, a method for producing a device wafer, and a method for regenerating a support wafer. In particular, the present disclosure relates to a composition used for decomposing and cleaning an adhesive including an adhesive polymer used for temporary bonding between a device wafer and a support wafer (carrier wafer), the adhesive remaining on the device wafer in a thinning process of a semiconductor wafer, a method for cleaning the adhesive polymer using the composition, a method for producing the device wafer, and a method for regenerating the support wafer.

BACKGROUND

In a three-dimensional mounting technology for densifying semiconductors, the thicknesses per sheet of semiconductor wafers are reduced, and a plurality of semiconductor wafers connected by a through silicon via (TSV) are laminated. Specifically, after thinning a device wafer having a semiconductor device formed thereon by polishing a surface (back surface) on which the semiconductor device is not formed, an electrode including a TSV is formed.

In the polishing step of the back surface of the device wafer, in order to impart mechanical strength to the device wafer, a support wafer, also referred to as a carrier wafer, is temporarily bonded using an adhesive on a surface on which the semiconductor device is formed of the device wafer. For example, a glass wafer or a silicon wafer is used as the support wafer. After the polishing step, the device wafer is separated (debonded) from the support wafer, the adhesive on the device wafer is peeled off, and the adhesive residue on the device wafer is cleaned off using a cleaning agent. There is a need for a decomposing cleaning agent capable of completely removing the adhesive remaining on the device wafer after debonding in a short time, that is, a cleaning agent having a high etch rate. It is also desirable from the standpoint of a cost and an environmental burden to completely remove the adhesive remaining on the support wafer and reuse the support wafer repeatedly.

An adhesive including a polyorganosiloxane compound having good heat resistance as an adhesive polymer is used for temporary bonding application of a device wafer. In particular, when the adhesive is a crosslinked polyorganosiloxane compound, two actions of cleavage of an Si—O bond and dissolution of a decomposed product by a solvent are required for a cleaning agent. Examples of such a cleaning agent include those obtained by dissolving a fluorine-based compound, such as tetrabutylammonium fluoride (TBAF) in a polar aprotic solvent. Since a fluoride ion of TBAF participates in the cleavage of an Si—O bond via Si—F bond formation, the cleaning agent can be provided with etch performance. Since the polar aprotic solvent can dissolve TBAF and does not form solvation via a hydrogen bonding with the fluoride ion, the reactivity of the fluoride ion can be increased.

In Non-Patent Literature 1 (Advanced Materials, 11, 6, 492 (1999)), a 1.0 M TBAF solution using THF, which is aprotic, as a solvent is used for decomposing, and dissolving and removing polydimethylsiloxane (PDMS).

In Non-Patent Literature 2 (Advanced Materials, 13, 8, 570 (2001)), NMP, DMF and DMSO, which are an aprotic solvent as with THF, are used as a solvent of TBAF.

Non-Patent Literature 3 (Macromolecular Chemistry and Physics, 217, 284-291 (2016)) describes results of examining PDMS etch rates with TBAF/organic solvents for each solvent, and also describes, with respect to THF and DMF, which have a high etch rate, a comparison of etch rates of TBAF solutions using mixed solvents having different ratios of THF/DMF.

Patent Literature 1 (KR 10-2016-0087089 A) and Patent Literature 2 (US 2017/0158888 A1) describe cleaning liquids in which TBAF is dissolved in a solvent of a nitrogen-containing heterocyclic compound.

Patent Literature 3 (JP 2014-146793 A), Patent Literature 4 (U.S. Pat. No. 6,818,608 B2), and Patent Literature 5 (JP 2004-000969 A) describe cleaning liquids in which TBAF is dissolved in a ketone or an ester.

CITATION LIST

Patent Literature

[PTL 1] KR 10-2016-0087089 A
[PTL 2] US 2017/0158888 A1
[PTL 3] JP 2014-146793 A
[PTL 4] U.S. Pat. No. 6,818,608 B2
[PTL 5] JP 2004-000969 A

Non-Patent Literature

[NPL 1] Advanced Materials, 11, 6, 492 (1999)
[NPL 2] Advanced Materials, 13, 8, 570 (2001)
[NPL 3] Macromolecular Chemistry and Physics, 217, 284-291 (2016)

SUMMARY

Technical Problem

It is considered that the role of a solvent in a cleaning agent containing a fluorine compound, such as TBAF, and the solvent is to sufficiently dissolve the fluorine compound which is highly polar and a reactive substance, thereby making the affinity of the fluorine compound for a surface of a less polar adhesive sufficient to ensure reactivity of fluoride ions included in the fluorine compound, and to dissolve a decomposed product of the adhesive.

In some cases, a substituent is introduced into an adhesive polymer contained in an adhesive for the purpose of improving heat resistance, releasability, etc., whereby the surface of the adhesive may exhibit various polarities. It is desirable that the cleaning agent exhibit excellent affinity for the surface of the adhesive exhibiting such various polarities, thereby achieving a high etch rate.

When a ketone or an ester is used as a solvent, a reaction of a fluorine compound, such as TBAF, with a solvent may occur. For example, when a ketone is used as the solvent, after preparation of the cleaning agent, the etch rate of the cleaning agent decreases with the lapse of the storage period. It is considered that this decrease in etch rate is ascribable to an aldol self-condensation reaction proceeding between ketone molecules in the presence of the fluorine compound, and deactivation of fluoride ions due to solvation of the reaction product, etc. Similarly, when an ester is used as the solvent, after preparation of the cleaning agent, the etch rate of the cleaning agent decreases with the lapse of the storage time. It is considered that this decrease in etch rate is ascribable to the progress of a hydrolysis reaction of the ester in the presence of the fluorine compound to give an alcohol and a carboxylic acid. The alcohol and carboxylic acid produced by the hydrolysis of the ester can both function as a protic solvent to solvate with a fluoride ion. Since the reactivity of the solvated fluoride ion decreases, the etch rate of the cleaning agent decreases with time.

The present disclosure provides a composition having high affinity for an adhesive surface and excellent long-term storage stability.

Solution to Problem

The present inventors have found that, in a composition containing a quaternary alkylammonium fluoride or a hydrate thereof, by using a plurality of specific aprotic solvents in combination, a high affinity is exhibited for an adhesive surface as compared with a case where a single solvent is used, so that the reaction activity of the quaternary alkylammonium fluoride can be effectively utilized, that is, a high etch rate can be achieved, and a decrease in etch rate can be suppressed to enable long-term storage of the composition.

That is, the present invention includes the following [1] to [15].

[1] A composition comprising a quaternary alkylammonium fluoride or a hydrate thereof and an aprotic solvent, the aprotic solvent comprising
(A) an N-substituted amide compound having 4 or more carbon atoms and having no active hydrogen on a nitrogen atom, and
(B) an ether compound.

[2] The composition according to [1], wherein the (A) N-substituted amide compound is a 2-pyrrolidone derivative compound represented by the formula (1):

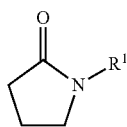

(1)

wherein, in the formula (1), $R^1$ represents an alkyl group having 1 to 4 carbon atoms.

[3] The composition according to [2], wherein the (A) N-substituted amide compound is a 2-pyrrolidone derivative compound in which $R^1$ is a methyl group or an ethyl group in the formula (1).

[4] The composition according to any one of [1] to [3], wherein the (B) ether compound has a flash point of 21° C. or higher.

[5] The composition according to any one of [1] to [4], wherein the (B) ether compound comprises a dialkyl ether of glycol represented by the formula (2):

$R^2O(C_nH_{2n}O)_xR^3$ (2), wherein, in the formula (2), $R^2$ and $R^3$ each independently represent an alkyl group selected from the group consisting of a methyl group, an ethyl group, a propyl group, an isopropyl group, an n-butyl group, an isobutyl group, a sec-butyl group, and a t-butyl group, n is 2 or 3, and x is an integer of 1 to 4.

[6] The composition according to [5], wherein the dialkyl ether of glycol is diethylene glycol dimethyl ether or dipropylene glycol dimethyl ether.

[7] The composition according to [5] or [6], wherein the (B) ether compound further comprises a dialkyl ether represented by the formula (3):

$R^4OR^5$ (3), wherein, in the formula, $R^4$ and $R^5$ each independently represent an alkyl group having 4 to 8 carbon atoms.

[8] The composition according to any one of [1] to [7], wherein the content of the (A) N-substituted amide compound is 15 to 85% by mass and the content of the (B) ether compound is 85 to 15% by mass, with respect to 100% by mass of the aprotic solvent.

[9] The composition according to any one of [1] to [8], wherein the content of the quaternary alkylammonium fluoride is 0.01 to 10% by mass.

[10] The composition according to any one of [1] to [9], wherein the quaternary alkylammonium fluoride is a tetraalkylammonium fluoride represented by $R^6R^7R^8R^9N^+F^-$, wherein $R^6$ to $R^9$ are each independently an alkyl group selected from the group consisting of a methyl group, an ethyl group, an n-propyl group, an isopropyl group, and an n-butyl group.

[11] The composition according to any one of [1] to [10], which is a decomposing cleaning composition for an adhesive polymer.

[12] The composition of [11], wherein the adhesive polymer is a polyorganosiloxane compound.

[13] A method for cleaning an adhesive polymer on a substrate by using the composition according to any one of [1] to [12].

[14] A method for producing a device wafer comprising cleaning an adhesive polymer on a device wafer by using the composition according to any one of [1] to [12].

[15] A method for regenerating a support wafer comprising cleaning an adhesive polymer on a support wafer by using the composition according to any one of [1] to [12].

Advantageous Effects of Invention

The composition of the present disclosure has high affinity for an adhesive surface and is excellent in long-term storage stability. Therefore, even when a relatively low concentration of fluorine compound is used in the composition, a high etch rate can be maintained over a long period of time. This is advantageous for both improving performance and achieving low cost of a cleaning agent.

The foregoing description should not be considered as disclosing all embodiments of the present invention and all advantages thereof.

DESCRIPTION OF EMBODIMENTS

Figure 1:
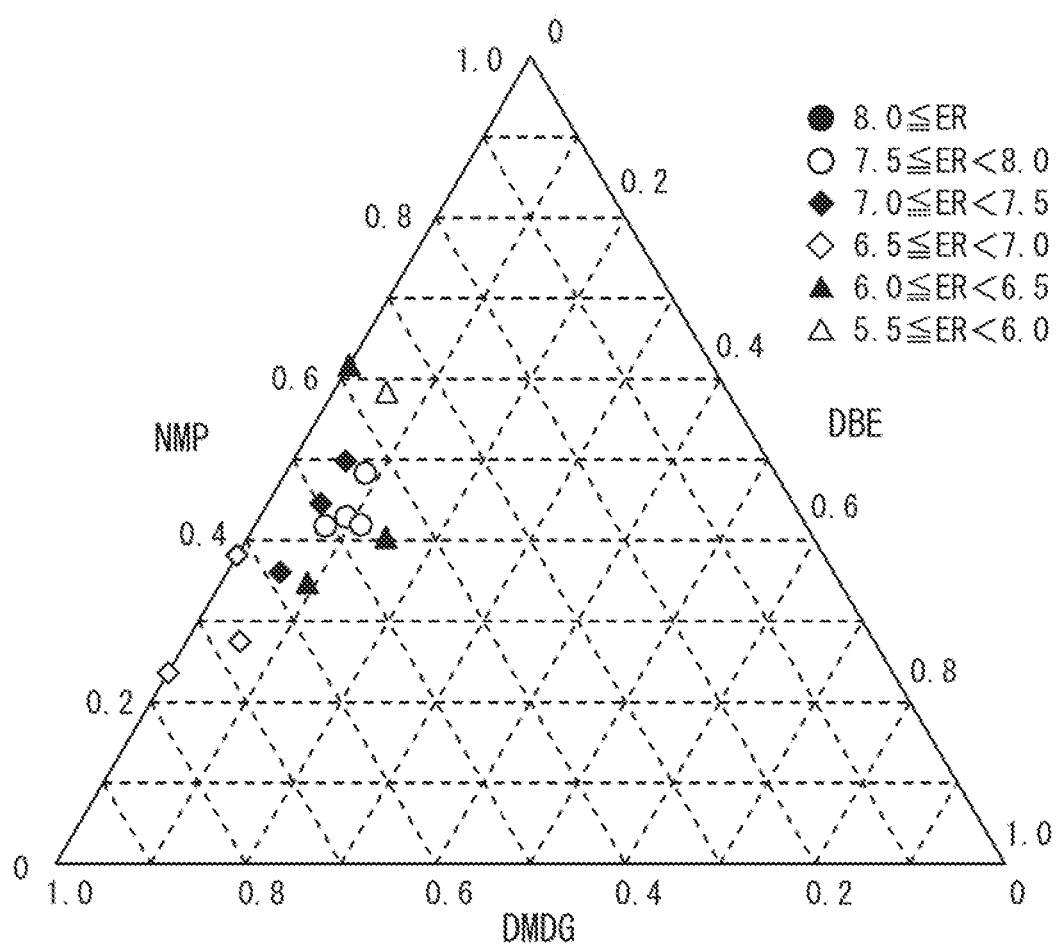
FIG. 1 is a ternary diagram showing the relationship between the composition and the etch rate (ER) of Examples 1 to 14.

Hereinafter, the present invention will be described in further detail.

[Composition]

A composition according to one embodiment comprises a quaternary alkylammonium fluoride or a hydrate of a quaternary alkylammonium fluoride, and a specific aprotic solvent.

<Quaternary Alkylammonium Fluoride or Hydrate Thereof>

The quaternary alkylammonium fluoride or a hydrate thereof releases a fluoride ion which is involved in cleavage of an Si—O bond. A quaternary alkylammonium moiety can allow the quaternary alkylammonium fluoride, which is a salt, to dissolve in an aprotic solvent. As the quaternary alkylammonium fluoride, various compounds can be used without any particular limitation. Examples of the hydrate of the quaternary alkylammonium fluoride include trihydrates, tetrahydrates, and pentahydrates. The quaternary alkylammonium fluoride may be one or a combination of two or more thereof.

In one embodiment, the quaternary alkylammonium fluoride is a tetraalkylammonium fluoride represented by $R^6R^7R^8R^9N^+F^-$, wherein $R^6$ to $R^9$ are each independently an alkyl group selected from the group consisting of a methyl group, an ethyl group, an n-propyl group, an isopropyl group, and an n-butyl group. Examples of such a quaternary alkylammonium fluoride include tetramethylammonium fluoride, tetraethylammonium fluoride, tetrapropylammonium fluoride, and tetrabutylammonium fluoride. From the viewpoint of decomposing cleaning performance, availability, prices, etc., it is preferable that the quaternary alkylammonium fluoride be tetrabutylammonium fluoride (TBAF).

In one embodiment, the content of the quaternary alkylammonium fluoride in the composition is 0.01 to 10% by mass. The "content of the quaternary alkylammonium fluoride" is a value converted as a mass of only the quaternary alkylammonium fluoride, excluding the mass of hydrate water, when a hydrate of the quaternary alkylammonium fluoride is contained in the composition. The content of the quaternary alkylammonium fluoride in the composition is preferably 0.01 to 5% by mass, more preferably 0.05 to 2% by mass, and still more preferably 0.1 to 1% by mass. In another embodiment, the content of the quaternary alkylammonium fluoride in the composition is preferably 0.5 to 9% by mass, more preferably 1 to 8% by mass, and still more preferably 2 to 5% by mass. By setting the content of quaternary alkylammonium fluoride to 0.01% by mass or more, an adhesive polymer can be effectively decomposed and cleaned, and by setting the content to 10% by mass or less, corrosion of a metal portion included in a device forming surface of a device wafer can be prevented or suppressed. The content of the quaternary alkylammonium fluoride in the composition may be 4% by mass or less, or 3% by mass or less, when prevention or suppression of corrosion of the metal portion, or reduction in cost associated with the use of the quaternary alkylammonium fluoride is particularly required. When a higher etch rate is required, the content of the quaternary alkylammonium fluoride in the composition may be 5% by mass or more, 6% by mass or more, or 7% by mass or more.

<Aprotic Solvent>

The aprotic solvent includes (A) an N-substituted amide compound having 4 or more carbon atoms and having no active hydrogen on a nitrogen atom, and (B) an ether compound.

In one embodiment, the content of the aprotic solvent in the composition is 70 to 99.99% by mass, preferably 80 to 99.95% by mass, and more preferably 90 to 99.9% by mass.

<(A) N-Substituted Amide Compound Having 4 or More Carbon Atoms and Having No Active Hydrogen on Nitrogen Atom>

The (A) N-substituted amide compound having 4 or more carbon atoms and having no active hydrogen on a nitrogen atom (also simply referred to as "(A) N-substituted amide compound" in the present disclosure) is an aprotic solvent having a relatively high polarity, and able to uniformly dissolve or disperse the quaternary alkylammonium fluoride and a hydrate thereof in the composition. In the present disclosure, "(A) N-substituted amide compound" also encompasses a urea compound (carbamide compound) having 4 or more carbon atoms and having no active hydrogen on a nitrogen atom. As the (A) N-substituted amide compound, various compounds can be used without particular limitation, and examples thereof include acyclic N-substituted amides, such as N,N-diethylformamide, N,N-dimethylacetamide, N,N-diethylacetamide, N,N-dimethylpropionamide, N,N-diethylpropionamide, and tetramethylurea, and cyclic N-substituted amides, such as 2-pyrrolidone derivatives, 2-piperidone derivatives, ε-caprolactam derivatives, 1,3-dimethyl-2-imidazolidinone, 1-methyl-3-ethyl-2-imidazolidinone, 1,3-diethyl-2-imidazolidinone, and 1,3-dimethyl-3,4,5,6-tetrahydro-2(1H)-pyrimidinone (N,N'-dimethylpropyleneurea). The (A) N-substituted amide compound may be one or a combination of two or more thereof.

In one embodiment, the (A) N-substituted amide compound is a 2-pyrrolidone derivative compound represented by the formula (1):

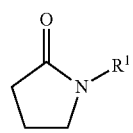

(1)

wherein, in the formula (1), $R^1$ represents an alkyl group having 1 to 4 carbon atoms. Examples of the alkyl group having 1 to 4 carbon atoms include a methyl group, an ethyl group, an n-propyl group, an isopropyl group, an n-butyl group, an isobutyl group, a sec-butyl group, and a t-butyl group. Examples of the 2-pyrrolidone derivative compound represented by the formula (1) include N-methylpyrrolidone, N-ethylpyrrolidone, N-propylpyrrolidone, and N-butylpyrrolidone.

The (A) N-substituted amide compound is preferably a 2-pyrrolidone derivative compound in which $R^1$ is a methyl group or an ethyl group in the formula (1), and more preferably a 2-pyrrolidone derivative compound in which $R^1$ is a methyl group in the formula (1), i.e., N-methylpyrrolidone, since they have relatively high polarity and excellent dissolving ability of the quaternary alkylammonium fluoride, and are easily available.

<(B) Ether Compound>

By combining the (B) ether compound with the (A) N-substituted amide compound, a mixed solvent system exhibiting high affinity for an adhesive surface can be formed. A composition using such a mixed solvent system can achieve a high etch rate in which the reaction activity of the quaternary alkylammonium fluoride is effectively utilized. As the (B) ether compound, various compounds can be used without particular limitation. The (B) ether compound may be one or a combination of two or more thereof. It is preferable that the (B) ether compound not contain an ester structure or an amide structure.

In one embodiment, the (B) ether compound comprises a dialkyl ether of glycol represented by the formula (2):

$$R^2O(C_nH_{2n}O)_xR^3 \qquad (2),$$

wherein, in the formula (2), $R^2$ and $R^3$ each independently represent an alkyl group selected from the group consisting of a methyl group, an ethyl group, a propyl group, an isopropyl group, an n-butyl group, an isobutyl group, a sec-butyl group, and a t-butyl group, n is 2 or 3, and x is an integer of 1 to 4.

Examples of the dialkyl ether of glycol represented by the formula (2) include ethylene glycol dimethyl ether, propylene glycol dimethyl ether, diethylene glycol dimethyl ether, dipropylene glycol dimethyl ether, tripropylene glycol dimethyl ether, tripropylene glycol diethyl ether, tripropylene glycol di(n-butyl) ether, tetraethylene glycol dimethyl ether, and tetrapropylene glycol dimethyl ether. The dialkyl ether of glycol represented by the formula (2) is preferably diethylene glycol dimethyl ether or dipropylene glycol dimethyl ether, from the viewpoint of decomposing cleaning performance, availability, price, etc., and more preferably dipropylene glycol dimethyl ether, since a high etch rate can be obtained with a wide range of composition.

The content of the dialkyl ether of glycol represented by the formula (2) is preferably 10 to 80% by mass, more preferably 15 to 70% by mass, and still more preferably 20 to 60% by mass, with respect to 100% by mass of the aprotic solvent. In another embodiment, the content of the dialkyl ether of glycol represented by the formula (2) is preferably 0 to 60% by mass, more preferably 3 to 50% by mass, and still more preferably 5 to 40% by mass, with respect to 100% by mass of the aprotic solvent.

In one embodiment, in addition to the dialkyl ether of glycol represented by the formula (2), the (B) ether compound further comprises a dialkyl ether represented by the formula (3):

$$R^4OR^5 \qquad (3),$$

wherein, in the formula, $R^4$ and $R^5$ each independently represent an alkyl group having 4 to 8 carbon atoms. The dialkyl ether represented by the formula (3) has lower polarity as compared with the dialkyl ether of glycol represented by the formula (2). By using two or more types of the (B) ether compounds having different polarities in combination, it is possible to effectively enhance the affinity for various adhesive surfaces to obtain a composition having a wide range of application.

In another embodiment, the (B) ether compound is a dialkyl ether represented by the formula (3):

$$R^4OR^5 \qquad (3),$$

wherein, in the formula, $R^4$ and $R^5$ each independently represent an alkyl group having 4 to 8 carbon atoms.

Examples of the dialkyl ether represented by the formula (3) include dibutyl ether, dipentyl ether, dihexyl ether, diheptyl ether, dioctyl ether, butyl hexyl ether, and butyl octyl ether. The dialkyl ether represented by the formula (3) is preferably dibutyl ether, from the viewpoint of decomposing cleaning performance, availability, price, etc.

The content of the dialkyl ether represented by the formula (3) is preferably 0 to 50% by mass, more preferably 1 to 35% by mass, and still more preferably 2 to 30% by mass, with respect to 100% by mass of the aprotic solvent. By setting the content of the dialkyl ether represented by the formula (3) to 0% by mass or more and 50% by mass or less, a higher etch rate can be obtained.

In one embodiment in which the dialkyl ether of glycol represented by the formula (2) is diethylene glycol dimethyl ether, the content of the dialkyl ether represented by the formula (3) is preferably 0 to 20% by mass, more preferably 2 to 15% by mass, and still more preferably 5 to 12% by mass, with respect to 100% by mass of the aprotic solvent. In this embodiment, by setting the content of the dialkyl ether represented by the formula (3) to 0% by mass or more and 20% by mass or less, a higher etch rate can be obtained.

In one embodiment in which the dialkyl ether of glycol represented by the formula (2) is dipropylene glycol dimethyl ether, the content of the dialkyl ether represented by the formula (3) is preferably 0 to 40% by mass, more preferably 5 to 30% by mass, and still more preferably 9 to 25% by mass, with respect to 100% by mass of the aprotic solvent. In another embodiment in which the dialkyl ether of glycol represented by the formula (2) is dipropylene glycol dimethyl ether, the content of the dialkyl ether represented by the formula (3) is preferably 0 to 40% by mass, more preferably 3 to 25% by mass, and still more preferably 7 to 20% by mass, with respect to 100% by mass of the aprotic solvent. In these embodiments, by setting the content of the dialkyl ether represented by the formula (3) to 0% by mass or more and 40% by mass or less, a higher etch rate can be obtained.

In one embodiment, the flash point of the (B) ether compound is 21° C. or higher. The use of the (B) ether compound having a flash point of 21° C. or higher, i.e., which is not applicable to hazardous materials, Category 4, Class 1 petroleums, can reduce the requirements for equipment, work environment, etc., in the production and use of the composition, as compared with the use of tetrahydrofuran (THF, flash point −17° C., hazardous materials, Category 4, Class 1 petroleums). For example, the flash points of diethylene glycol dimethyl ether, dipropylene glycol dimethyl ether, and dibutyl ether are 51° C., 60° C., and 25° C., respectively. The flash point is measured by the tag closed cup method (JIS K 2265-1:2007).

In one embodiment, the content of the (A) N-substituted amide compound is 10 to 90% by mass, and the content of (B) ether compound is 90 to 10% by mass, with respect to 100% by mass of the aprotic solvent. With respect to 100% by mass of the aprotic solvent, it is preferable that the content of the (A) N-substituted amide compound be 15 to 85% by mass, and the content of the (B) ether compound be 85 to 15% by mass, and it is more preferable that the content of the (A) N-substituted amide compound be 25 to 65% by mass, and the content of the (B) ether compound be 75 to 35% by mass. In another embodiment, it is more preferable that the content of the (A) N-substituted amide compound be 40 to 80% by mass, and the content of the (B) ether compound be 60 to 20% by mass, with respect to 100% by mass of the aprotic solvent. By setting the content of the (A) N-substituted amide compound and the (B) ether compound within the above ranges, the quaternary alkylammonium fluoride and the hydrate thereof can be uniformly dissolved in the composition, and a high etch rate can be obtained for various adhesive surfaces.

In one embodiment in which the dialkyl ether of glycol represented by the formula (2) is diethylene glycol dimethyl ether, with respect to 100% by mass of the aprotic solvent, it is preferable that the content of the (A) N-substituted amide compound be 30 to 60% by mass, and the content of the (B) ether compound be 70 to 40% by mass, and it is more preferable that the content of the (A) N-substituted amide compound be 34 to 50% by mass, and the content of the (B) ether compound be 66 to 50% by mass. In this embodiment, by setting the content of the (A) N-substituted amide compound and the (B) ether compound within the above ranges, the quaternary alkylammonium fluoride and the hydrate thereof can be uniformly dissolved in the composition, and a higher etch rate can be obtained for various adhesive surfaces.

In one embodiment in which the dialkyl ether of glycol represented by the formula (2) is dipropylene glycol dimethyl ether, with respect to 100% by mass of the aprotic solvent, it is preferable that the content of the (A) N-substituted amide compound be 20 to 80% by mass, and the content of the (B) ether compound be 80 to 20% by mass, and it is more preferable that the content of the (A) N-substituted amide compound be 30 to 60% by mass, and the content of the (B) ether compound be 70 to 40% by mass. In another embodiment in which the dialkyl ether of glycol represented by the formula (2) is dipropylene glycol dimethyl ether, with respect to 100% by mass of the aprotic solvent, it is preferable that the content of the (A) N-substituted amide compound be 25 to 85% by mass, and the content of the (B) ether compound be 75 to 15% by mass, and it is more preferable that the content of the (A) N-substituted amide compound be 50 to 80% by mass, and the content of the (B) ether compound be 50 to 20% by mass. In these embodiments, by setting the content of the (A) N-substituted amide compound and the (B) ether compound within the above ranges, the quaternary alkylammonium fluoride and the hydrate thereof can be uniformly dissolved in the composition, and a higher etch rate can be obtained for various adhesive surfaces.

In one embodiment, with respect to 100% by mass of the aprotic solvent, the content of the (A) N-substituted amide compound is 20 to 90% by mass, the content of the dialkyl ether of glycol represented by the formula (2) is 10 to 80% by mass, and the content of the dialkyl ether represented by the formula (3) is 0 to 30% by mass. It is preferable that the content of the (A) N-substituted amide compound be 25 to 80% by mass, the content of the dialkyl ether of glycol represented by the formula (2) be 20 to 60% by mass, and the content of the dialkyl ether represented by the formula (3) be 0 to 30% by mass. In another embodiment, with respect to 100% by mass of the aprotic solvent, the content of the (A) N-substituted amide compound is 20 to 90% by mass, the content of the dialkyl ether of glycol represented by the formula (2) is 0 to 70% by mass, and the content of the dialkyl ether represented by the formula (3) is 0 to 30% by mass, provided that at least one of the content of the dialkyl ether of glycol represented by the formula (2) and the content of the dialkyl ether represented by the formula (3) is more than 0% by mass. It is preferable that the content of the (A) N-substituted amide compound be 30 to 85% by mass, the content of the dialkyl ether of glycol represented by the formula (2) be 3 to 50% by mass, and the content of the dialkyl ether represented by the formula (3) be 0 to 30% by mass.

<Additives and Other Ingredients>

The composition may contain, as an optional component, additives, such as an antioxidant, a surfactant, a preservative, and an antifoaming agent, within a range not significantly impairing the effect of the present invention.

In one embodiment, the composition is substantially free or free of a protic solvent. For example, the content of the protic solvent in the composition may be 5% by mass or less, 3% by mass or less, or 1% by mass or less. The protic solvent that may be contained in the composition may be water derived from the hydrate of the quaternary alkylammonium fluoride.

In one embodiment, the composition is substantially free or free of an aprotic solvent selected from ketones and esters. For example, the content of the aprotic solvent selected from ketones and esters in the composition may be 1% by mass or less, 0.5% by mass or less, or 0.1% by mass or less.

[Method for Cleaning Adhesive Polymer]

The composition of the present disclosure can be used as a decomposing cleaning composition of an adhesive polymer contained in various adhesives. The adhesive polymer is not particularly limited as long as it can be cleaned by using the composition of the present disclosure. In addition to the adhesive polymer, the adhesive may contain, as an optional component, a curing agent, a curing accelerator, a crosslinking agent, a surfactant, a leveling agent, a filler, etc.

In one embodiment, the adhesive polymer includes an Si—O bond. The adhesive polymer is reduced in molecular weight or loses its crosslinked structure due to cleavage of an Si—O bond by a fluoride ion of the quaternary alkylammonium fluoride, so that it can be dissolved in the aprotic solvent, and as a result, the adhesive polymer can be removed from a surface, such as that of a device wafer.

The adhesive polymer including an Si—O bond is preferably a polyorganosiloxane compound. Since the polyorganosiloxane compound includes a large number of siloxane (Si—O—Si) bonds, it can be effectively decomposed and cleaned by using the composition. Examples of the polyorganosiloxane compound include silicone elastomers, silicone gels, and silicone resins, such as MQ resins, and modified products thereof, such as epoxy-modified products, acrylic-modified products, methacrylic-modified products, amino-modified products, and mercapto-modified products thereof. The polyorganosiloxane compound may be a silicone-modified polymer, such as a silicone-modified polyurethane, and a silicone-modified acrylic resin.

In one embodiment, the adhesive polymer is an addition-curable silicone elastomer, a silicone gel, or a silicone resin. These addition-curable silicones contain an ethylenically unsaturated group-containing polyorganosiloxane, such as a vinyl-terminated polydimethylsiloxane or a vinyl-terminated MQ resin, and a polyorganohydrosiloxane, such as a polymethylhydrosiloxane, as a crosslinking agent, and are cured by using a hydrosilylation catalyst, such as a platinum catalyst.

In another embodiment, the adhesive polymer includes an aralkyl group-, epoxy group-, or phenyl group-containing polydiorganosiloxane, in particular, an aralkyl group-, epoxy group-, or phenyl group-containing polydimethylsiloxane. An adhesive containing such an adhesive polymer may be used for temporary bonding, in combination with an adhesive containing the addition-curable silicone described above.

Cleaning of an adhesive polymer on a substrate, such as a silicon wafer, can be carried out in various conventionally known methods using the composition. A method for cleaning an adhesive polymer includes, for example, discharging the composition onto a substrate so that the composition contacts an adhesive polymer while rotating the substrate at a predetermined speed using a spin coater, etc., (spin etch), spraying the composition onto an adhesive polymer on a substrate (spraying), or immersing a substrate having thereon an adhesive polymer in a tank containing the composition (dipping). The temperature of the decomposing cleaning may vary depending on the type of the adhesive polymer and the deposited amount thereof on the substrate, and is generally 20° C. to 90° C., and preferably 40° C. to 60° C. The time of the decomposing cleaning may vary depending on the type of the adhesive polymer and the deposited amount thereof on the substrate, and is generally from 5 seconds to 10 hours, and preferably from 10 seconds to 2 hours. During the decomposing cleaning, ultrasonic may be applied to a bath of the composition or the substrate.

After the decomposing cleaning, the substrate may be rinsed using an alcohol, such as isopropyl alcohol (IPA), or ion-exchanged water (DIW), and the substrate may be dried by spraying with nitrogen gas, air, etc., or heating under normal pressure or under reduced pressure, etc.

[Method for Producing Device Wafer]

In one embodiment, a method for producing a device wafer includes cleaning an adhesive polymer on a device wafer by using the composition. After cleaning, the device wafer may be rinsed or dried as necessary.

A method for producing a device wafer may further include: forming a semiconductor device on a substrate, such as a silicon wafer, to obtain a device wafer; opposing a surface of the device wafer on which the semiconductor device is formed and a support wafer to temporarily bond the device wafer and the support wafer via an adhesive containing an adhesive polymer; thinning the device wafer by polishing a surface (back surface) opposite the surface of the device wafer on which the semiconductor device is formed; and separating the support wafer from the device wafer. Formation of the semiconductor device, temporary bonding of the device wafer and the support wafer, polishing of the back surface of the device wafer, and separation of the device wafer from the support wafer can be carried out in conventionally known methods and are not particularly limited.

[Method for Regenerating Support Wafer]

The composition can be used to regenerate a support wafer used in the manufacture of a device wafer. In one embodiment, a method for regenerating a support wafer includes cleaning an adhesive polymer on a support wafer by using the composition. After cleaning, the support wafer may be rinsed or dried as necessary.

EXAMPLES

Hereinafter, the present invention will be described in more detail based on the Examples, but the present invention is not limited by the Examples.

Preparation of Compositions (5% by Mass TBAF/Mixed Solvents)

Example 1

To a 125 mL polyethylene container, 0.935 g of tetrabutylammonium fluoride trihydrate (TBAF·3H$_2$O) (Kanto Chemical Co., Inc., 97% special grade) was added, and then 5.085 g of N-methyl-2-pyrrolidone (NMP), 8.229 g of diethylene glycol dimethyl ether (hereinafter referred to as "DMDG"), and 0.79 g of dibutyl ether (DBE) were added in this order and mixed to dissolve TBAF·3H$_2$O. In this way, a composition of 5% by mass TBAF mixed solvents was prepared in which the mass ratio of NMP:diethylene glycol dimethyl ether:dibutyl ether was 0.361:0.583:0.056.

Examples 2 to 39 and Comparative Examples 1 to 9

Except that the compositions were changed as shown in Table 1, the compositions were prepared in the same manner as in Example 1.

Examples 40 to 42 and Comparative Example 10

Except that N, N-dimethylpropionamide (DMPA) was used as the N-substituted amide compound, and the compositions were changed as shown in Table 2, the compositions were prepared in the same manner as in Example 1.

Method a for Preparing a Silicon Wafer Test Piece Having an Adhesive Layer Containing a Polyorganosiloxane Compound On a 12 inch (300 mm) silicon wafer (770 μm thick), an addition-curable silicone resin was applied by spin coating so as to have a dry film thickness of 110 μm. Thereafter, an adhesive layer was formed on the silicon wafer by heating on a hot plate at 140° C. for 15 minutes and at 190° C. for 10 minutes. The silicon wafer having the adhesive layer was divided into test pieces each having a size of 4 cm×4 cm, and the thickness of the center portion of the test piece was measured using a micrometer.

Cleaning Test 1

A 90 mm diameter SUS petri dish was charged with 7.0 mL of the composition immediately after preparation (within 30 minutes after preparation). One test piece prepared by the above method A was immersed in the composition, and the petri dish was shaken back and forth at a frequency of 1 Hz for 5 minutes at room temperature (25° C.). After the immersion, the test piece was removed by using tweezers, immersed in isopropyl alcohol (IPA), and further rinsed thoroughly by using an IPA wash bottle. Thereafter, the test piece was immersed in ion-exchanged water (DIW) and thoroughly rinsed by using a DIW wash bottle in the same manner. After spraying nitrogen gas to the test piece to dry water attached thereon, the test piece was heated and dried in a dryer at 125° C. for 30 minutes. The thickness of the center portion of the test piece after drying was measured using a micrometer.

The etch rate (ER) of the composition was calculated by dividing the difference in the thicknesses of the test piece before and after immersion by the immersion time in the composition.

Etch rate(ER)(μm/min)=[(thickness of test piece before immersion−thickness of test piece after immersion,washing and drying)(μm)]/immersion time(5 min)

Figure 2:
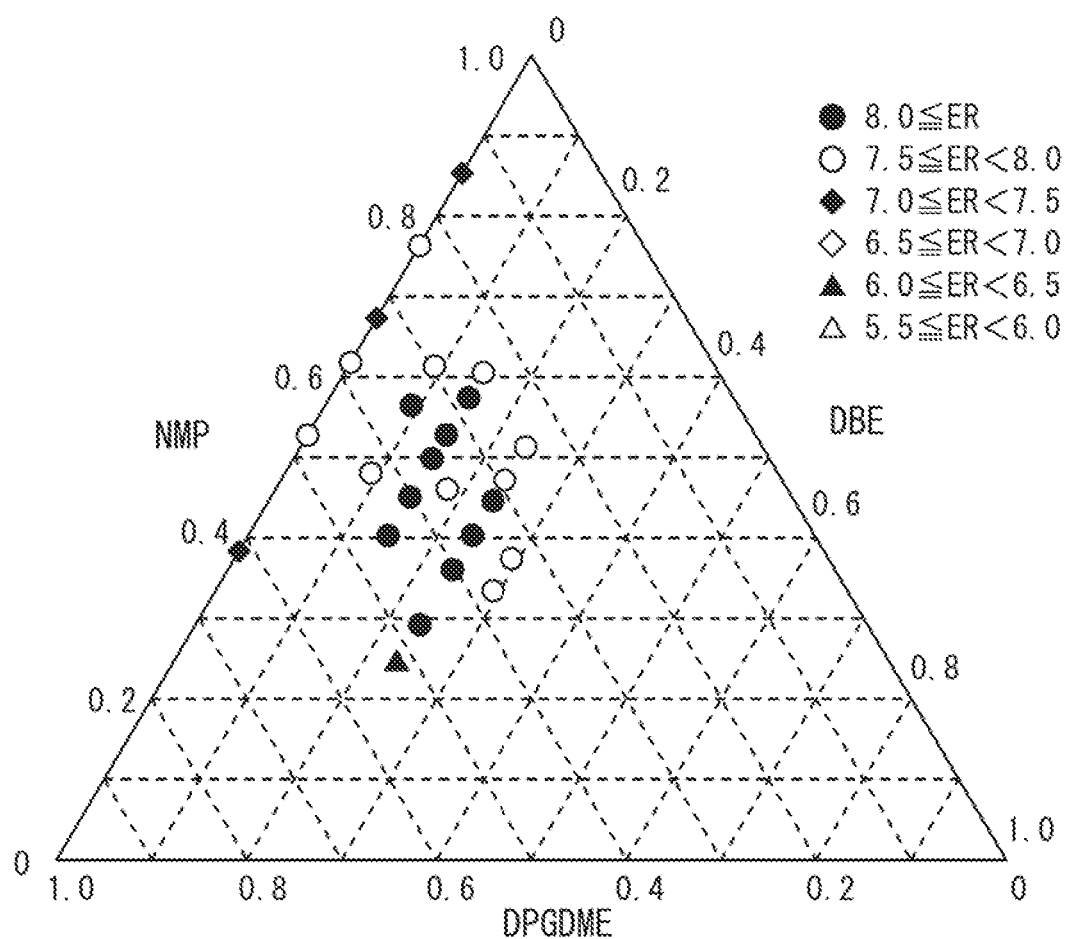
FIG. 2 is a ternary diagram showing the relationship between the composition and the etch rate (ER) of Examples 15 to 39.

The etch rates immediately after preparation of the compositions of Examples 1 to 39 and Comparative Examples 1 to 9 are shown in Table 1, and the etch rates immediately after preparation of the compositions of Examples 40 to 42 and Comparative Example 10 are shown in Table 2, respectively. The relationship between the compositions of Examples 1 to 14 (two-component system of NMP/DMDG and three-component system of NMP/DMDG/DBE) and the etch rates (ER) is shown in FIG. 1, and the relationship between the compositions of Examples 15 to 39 (two-component system of NMP/dipropylene glycol dimethyl ether (hereinafter referred to as "DPGDME") and three-component system of NMP/DPGDME/DBE) and the etch rate (ER) is shown in FIG. 2, in the form of a ternary diagram, respectively.

TABLE 1

| | TBAF | (A) N-substituted amide compound N-Methyl-2-pyrrolidone (NMP) | (B1) Glycol dialkyl ether Diethylene glycol dimethyl ether (DMDG) | (B1) Glycol dialkyl ether Dipropylene glycol dimethyl ether (DPGDME) | (B2) Dialkyl ether Dibutyl ether (DBE) | Ketone 2-Heptanone | Ketone Methyl ethyl ketone (MEK) | Ester Butyl acetate (n-BuOAc) | Etch rate immediately after Preparation (μm/min) |
|---|---|---|---|---|---|---|---|---|---|
| Ex. 1 | 5% by mass | 0.361 | 0.583 | — | 0.056 | — | — | — | 7.2 |
| Ex. 2 | | 0.348 | 0.562 | — | 0.091 | — | — | — | 6.0 |
| Ex. 3 | | 0.446 | 0.498 | — | 0.056 | — | — | — | 7.4 |
| Ex. 4 | | 0.275 | 0.669 | — | 0.056 | — | — | — | 6.8 |
| Ex. 5 | | 0.584 | 0.360 | — | 0.056 | — | — | — | 5.6 |
| Ex. 6 | | 0.499 | 0.445 | — | 0.056 | — | — | — | 7.2 |
| Ex. 7 | | 0.429 | 0.480 | — | 0.091 | — | — | — | 7.8 |
| Ex. 8 | | 0.404 | 0.451 | — | 0.145 | — | — | — | 6.4 |
| Ex. 9 | | 0.420 | 0.469 | — | 0.111 | — | — | — | 7.6 |
| Ex. 10 | | 0.419 | 0.507 | — | 0.074 | — | — | — | 7.6 |
| Ex. 11 | | 0.484 | 0.432 | — | 0.084 | — | — | — | 7.6 |
| Ex. 12 | | 0.382 | 0.618 | — | — | — | — | — | 6.8 |
| Ex. 13 | | 0.618 | 0.382 | — | — | — | — | — | 6.4 |
| Ex. 14 | | 0.236 | 0.764 | — | — | — | — | — | 6.6 |
| Ex. 15 | | 0.565 | — | 0.344 | 0.091 | — | — | — | 8.0 |
| Ex. 16 | | 0.529 | — | 0.326 | 0.146 | — | — | — | 8.0 |
| Ex. 17 | | 0.472 | — | 0.292 | 0.236 | — | — | — | 7.8 |
| Ex. 18 | | 0.575 | — | 0.279 | 0.146 | — | — | — | 8.0 |
| Ex. 19 | | 0.606 | — | 0.248 | 0.146 | — | — | — | 7.6 |
| Ex. 20 | | 0.514 | — | 0.249 | 0.237 | — | — | — | 7.6 |
| Ex. 21 | | 0.451 | — | 0.403 | 0.146 | — | — | — | 8.2 |
| Ex. 22 | | 0.404 | — | 0.361 | 0.236 | — | — | — | 8.4 |
| Ex. 23 | | 0.614 | — | 0.296 | 0.090 | — | — | — | 7.8 |
| Ex. 24 | | 0.375 | — | 0.334 | 0.291 | — | — | — | 7.6 |
| Ex. 25 | | 0.361 | — | 0.403 | 0.236 | — | — | — | 8.2 |
| Ex. 26 | | 0.403 | — | 0.450 | 0.147 | — | — | — | 8.0 |
| Ex. 27 | | 0.335 | — | 0.373 | 0.292 | — | — | — | 7.6 |
| Ex. 28 | | 0.292 | — | 0.472 | 0.236 | — | — | — | 8.0 |
| Ex. 29 | | 0.447 | — | 0.318 | 0.236 | — | — | — | 8.2 |
| Ex. 30 | | 0.499 | — | 0.356 | 0.145 | — | — | — | 8.0 |
| Ex. 31 | | 0.481 | — | 0.429 | 0.090 | — | — | — | 7.8 |
| Ex. 32 | | 0.461 | — | 0.359 | 0.180 | — | — | — | 7.6 |
| Ex. 33 | | 0.250 | — | 0.515 | 0.236 | — | — | — | 6.4 |
| Ex. 34 | | 0.854 | — | 0.146 | — | — | — | — | 7.0 |
| Ex. 35 | | 0.383 | — | 0.617 | — | — | — | — | 7.0 |
| Ex. 36 | | 0.619 | — | 0.381 | — | — | — | — | 7.8 |
| Ex. 37 | | 0.764 | — | 0.236 | — | — | — | — | 7.8 |
| Ex. 38 | | 0.528 | — | 0.472 | — | — | — | — | 7.8 |
| Ex. 39 | | 0.674 | — | 0.326 | — | — | — | — | 7.4 |
| Comp. Ex. 1 | | 1.000 | — | — | — | — | — | — | 5.0 |
| Comp. Ex. 2 | | — | 1.000 | — | — | — | — | — | n.a. *) |
| Comp. Ex. 3 | | — | — | 1.000 | — | — | — | — | n.a. *) |
| Comp. Ex. 4 | | — | — | — | 1.000 | — | — | — | n.a. *) |
| Comp. Ex. 5 | | — | — | — | — | 1.000 | — | — | 6.6 |
| Comp. Ex. 6 | | — | — | — | — | — | 1.000 | — | 12.0 |
| Comp. Ex. 7 | | — | — | — | — | — | — | 1.000 | n.a. *) |
| Comp. Ex. 8 | | 0.250 | — | — | — | — | — | 0.750 | 7.6 |
| Comp. Ex. 9 | | 0.250 | — | — | — | 0.750 | — | — | 8.2 |

*) Since TBAF equivalent to 5% could not be dissolved, an etch rate was not measured.

TABLE 2

| | TBAF | (A) N-substituted amide compound N,N-Dimethyl propionamide (DMPA) | (B1) Glycol dialkyl ether Dipropylene glycol dimethyl ether (DPGDME) | Etch rate immediately after preparation (μm/min) |
|---|---|---|---|---|
| Ex. 40 | 5% by mass | 0.765 | 0.235 | 6.6 |
| Ex. 41 | | 0.618 | 0.382 | 6.4 |
| Ex. 42 | | 0.382 | 0.618 | 6.0 |
| Comp. Ex. 10 | | 1.000 | — | 5.2 |

Storage Stability Test 1

Cleaning test 1 was carried out using the compositions immediately after preparation and after storage for a predetermined number of days at room temperature (25° C.), and the etch rate of the composition was calculated. The results are shown in Table 3. In Table 3, the values in parentheses following the etch rates represent the retention rate of the etch rate, when the etch rate immediately after preparation (0 days elapsed after preparation) is taken as 100%.

Except that the silicon wafer having the adhesive layer was divided into a size of 1.5 cm×1.5 cm to form test pieces, silicon wafer test pieces were prepared in the same manner as in the above method A.

Cleaning Test 2

A screw tube bottle having a volume of 50 cc was placed on top of a magnetic stirrer. The screw tube bottle was charged with 15.0 mL of the composition immediately after preparation (within 30 minutes after preparation) and a

TABLE 3

(etch rate (μm/min), values in parentheses represent a retention rate when an etch rate immediately after preparation (0 days elapsed after preparation) is taken as 100%.)

Cleaning Test 1

| Elapsed days after preparation (days) | Ex. 7 TBAF + NMP/DMDG/ DBE = 0.429 /0.480/ 0.091 | Ex. 12 TBAF + NMP/ DMDG = 0.382/ 0.618 | Ex. 32 TBAF + NMP/ DPGDME/ DBE = 0.461/0.359/ 0.180 | Ex. 39 TBAF + NMP/ DPGDME = 0.674/ 0.326 | Comp. Ex. 1 TBAF + NMP | Comp. Ex. 5 TBAF + 2-heptanone | Comp. Ex. 6 TBAF + MEK | Comp. Ex. 8 TBAF + NMP/n-BuOAc = 0.250/ 0.750 | Comp. Ex. 9 TBAF + NMP/2-heptanone = 0.250/ 0.750 |
|---|---|---|---|---|---|---|---|---|---|
| 0 | 7.8 | 6.8 | 7.6 | 7.4 | 5.0 | 6.6 | 12.0 | 7.6 | 8.2 |
| 5 | 6.8 (87%) | — | — | — | — | 4.0 (61%) | — | 3.4 (45%) | 5.6 (68%) |
| 6 | — | — | 7.4 (97%) | — | — | — | 5.6 (47%) | — | — |
| 8 | — | — | — | 7.0 (95%) | — | — | — | — | — |
| 10 | 6.0 (77%) | — | — | — | 4.2 (84%) | — | — | 3.0 (39%) | — |
| 12 | — | — | — | — | — | 2.2 (33%) | — | — | 4.2 (51%) |
| 13 | — | — | 7.8 (103%) | — | — | — | 5.2 (43%) | — | — |
| 15 | — | — | — | 7.0 (95%) | — | — | — | — | — |
| 17 | 6.2 (79%) | — | — | — | — | — | — | — | — |
| 20 | — | — | — | — | 3.8 (76%) | — | — | — | — |
| 21 | — | — | 7.2 (95%) | — | — | — | — | — | — |
| 24 | — | — | — | — | — | — | — | 2.4 (32%) | — |
| 29 | — | 5.8 (85%) | — | — | — | — | — | — | — |
| 31 | 5.6 (72%) | — | — | — | — | — | — | — | — |
| 33 | — | — | — | — | 4.0 (80%) | — | — | — | — |

The compositions of Examples 7, 12, 32 and 39 exhibited high etch rates not only immediately after preparation but also after 15 to 31 days elapsed, as compared with the compositions of Comparative Examples.

Preparation of Compositions (7.7% by Mass TBAF/Mixed Solvents)

Examples 43 to 49 and Comparative Examples 11 to 14

Except that TBAF was used in an amount so that its concentration in the composition was 7.7% by mass, and the compositions were changed as shown in Table 4, the compositions were prepared in the same manner as in Example 1.

Examples 50 to 53 and Comparative Example 15

Except that N-ethyl-2-pyrrolidone (NEP) was used as the N-substituted amide compound, and the compositions were changed as shown in Table 5, the compositions were prepared in the same manner as in Example 43.

Examples 54 to 56 and Comparative Example 16

Except that 1,3-dimethyl-2-imidazolidinone (DMI) was used as the N-substituted amide compound, and the compositions were changed as shown in Table 6, the compositions were prepared in the same manner as in Example 43.

Method B for Preparing a Silicon Wafer Test Piece Having an Adhesive Layer Containing a Polyorganosiloxane Compound stirrer. One test piece prepared by the above method B was immersed in the composition, and the stirrer was rotated at a rotation speed of 900 rpm for 3 minutes at room temperature (25° C.). After the immersion, the test piece was removed by using tweezers and thoroughly rinsed by using an isopropyl alcohol (IPA) wash bottle. After spraying nitrogen gas to the test piece to dry, the thickness of the center portion of the test piece was measured using a micrometer.

The etch rate (ER) of the composition was calculated by dividing the difference in the thicknesses of the test piece before and after immersion by the immersion time in the composition.

Etch rate(ER)(μm/min)=[(thickness of test piece before immersion−thickness of test piece after immersion,washing and drying)(μm)]/immersion time(3 min)

The etch rates immediately after preparation of the compositions of Examples 43 to 49 and Comparative Examples 11 to 14 are shown in Table 4, the etch rates immediately after preparation of the compositions of Examples 50 to 53 and Comparative Example 15 are shown in Table 5, and the etch rates immediately after preparation of the compositions of Examples 54 to 56 and Comparative Example 16 are shown in Table 6, respectively.

Method C for Preparing a Silicon Wafer Test Piece Having an Adhesive Layer Containing a Polyorganosiloxane Compound A 12 inch (300 mm) silicon wafer (770 μm thick) was divided into a size of 1.5 cm×1.5 cm. An adhesive obtained by mixing 2.036 g of a main agent of SYLGARD® 184 (manufactured by Toray Dow Corning Co., Ltd.) and 0.209 g of a curing agent was sucked out by a Pasteur pipette, and one drop was placed onto the divided silicon wafer. Thereafter, the silicon wafer was heated in a dryer at 125° C. for 20 minutes to form an adhesive layer on the silicon wafer. This was made to be a test piece, and the thickness of the central portion of the test piece was measured using a micrometer.

Cleaning Test 3

Except that the test piece prepared by the above method C was used, the etch rate (ER) of the composition was calculated in the same manner as in Cleaning test 2.

The etch rates immediately after preparation of the compositions of Examples 43, 44 and 47, and Comparative Examples 11 to 14 are shown in Table 4, the etch rates immediately after preparation of the compositions of Examples 50 to 53 and Comparative Example 15 are shown in Table 5, and the etch rates immediately after preparation of the compositions of Examples 54 to 56 and Comparative Example 16 are shown in Table 6, respectively.

TABLE 4

| | | Solvent composition (mass ratio) | | | | | Etch rate | |
| --- | --- | --- | --- | --- | --- | --- | --- | --- |
| | | (A) N-substituted amide compound N-Methyl-2-pyrrolidone (NMP) | (B1) Glycol dialkyl ether Dipropylene glycol dimethyl ether (DPGDME) | (B2) Dialkyl ether Dibutyl ether (DBE) | Ketone Methyl ethyl ketone (MEK) | Ester Butyl acetate (n-BuOAc) | immediately after preparation (μm/min) | |
| | TBAF | | | | | | Cleaning test 2 | Cleaning Test 3 |
| Ex. 43 | 7.7% by mass | 0.618 | 0.382 | — | — | — | 17.7 | 18.7 |
| Ex. 44 | | 0.236 | 0.764 | — | — | — | 13.0 | 21.7 |
| Ex. 45 | | 0.748 | 0.128 | 0.124 | — | — | 20.3 | — |
| Ex. 46 | | 0.825 | 0.030 | 0.146 | — | — | 19.0 | — |
| Ex. 47 | | 0.777 | 0.078 | 0.146 | — | — | 20.3 | 15.7 |
| Ex. 48 | | 0.653 | 0.201 | 0.146 | — | — | 19.8 | — |
| Ex. 49 | | 0.764 | — | 0.236 | — | — | 18.3 | — |
| Comp. Ex. 11 | | 1.000 | — | — | — | — | 13.3 | 10.7 |
| Comp. Ex. 12 | | — | 1.000 | — | — | — | n.a..) | n.a. *) |
| Comp. Ex. 13 | | — | — | — | 1.000 | — | 23.0 | 36.3 |
| Comp. Ex. 14 | | 0.250 | — | — | — | 0.750 | 19.0 | 19.7 |

*) Since TBAF equivalent to 7.7% could not be dissolved, an etch rate was not measured.

TABLE 5

| | | Solvent composition (mass ratio) | | | Etch rate | |
| --- | --- | --- | --- | --- | --- | --- |
| | | (A) N-substituted amide compound N-Ethyl-2-pyrrolidone (NEP) | (B1) Glycol dialkyl ether Dipropylene glycol dimethyl ether (DPGDME) | (B2) Dialkyl ether Dibutyl ether (DBE) | immediately after preparation (μm/min) | |
| | TBAF | | | | Cleaning test 2 | Cleaning Test 3 |
| Ex. 50 | 7.7% by mass | 0.618 | 0.382 | — | 14.3 | 22.0 |
| Ex. 51 | | 0.382 | 0.618 | — | 11.7 | 20.7 |
| Ex. 52 | | 0.653 | 0.201 | 0.146 | 18.7 | 21.0 |
| Ex. 53 | | 0.292 | 0.472 | 0.236 | 13.0 | 21.3 |
| Comp. Ex. 15 | | 1.000 | — | — | 15.0 | 17.3 |

TABLE 6

| | | Solvent composition (mass ratio) | | | Etch rate | |
| --- | --- | --- | --- | --- | --- | --- |
| | | (A) N-substituted amide compound 1,3-Dimethyl-2-imidazolidinone (DMI) | (B1) Glycol dialkyl ether Dipropylene glycol dimethyl ether (DPGDME) | (B2) Dialkyl ether Dibutyl ether (DBE) | immediately after preparation (μm/min) | |
| | TBAF | | | | Cleaning test 2 | Cleaning Test 3 |
| Ex. 54 | 7.7% by mass | 0.618 | 0.382 | — | 10.7 | 11.7 |
| Ex. 55 | | 0.382 | 0.618 | — | 13.7 | 18.3 |
| Ex. 56 | | 0.653 | 0.201 | 0.146 | 10.7 | 12.3 |
| Comp. Ex. 16 | | 1.000 | — | — | 8.0 | 6.0 |

Storage Stability Test 2

Cleaning test 2 was carried out using the compositions immediately after preparation and after storage for a predetermined number of days at room temperature (25° C.), and the etch rate of the composition was calculated. The results are shown in Table 7. In Table 7, the values in parentheses following the etch rates represent the retention rate of the etch rate, when the etch rate immediately after preparation (0 days elapsed after preparation) is taken as 100%.

TABLE 7

(etch rate (μm/min), values in parentheses represent a retention rate when an etch rate immediately after preparation (0 days elapsed after preparation) is taken as 100%.)
Cleaning test 2

| Elapsed days after preparation (days) | Ex. 44 TBAF + NMP/ DPGDME = 0.236/0.764 | Ex. 47 TBAF + NMP/ DPGDME/ DBE = 0.777/0.078/ 0.146 | Ex. 52 TBAF + NEP/ DPGDME/ DBE = 0.653/0.201/ 0.146 | Ex. 55 TBAF + DMI/DPGDME = 0.382/0.618 | Comp. Ex. 11 TBAF + NMP | Comp. Ex. 13 TBAF + MEK | Comp. Ex. 14 TBAF + NMP/n-BuOAc = 0.250/ 0.750 |
|---|---|---|---|---|---|---|---|
| 0 | 13.0 | 20.3 | 18.7 | 13.7 | 13.3 | 23.0 | 19.0 |
| 7 | — | 17.3 (85%) | — | — | — | — | 6.3 (33%) |
| 10 | 11.7 (90%) | 17.3 (85%) | — | — | 11.0 (83%) | 12.7 (55%) | — |
| 11 | — | — | 18.3 (98%) | 13.3 (97%) | — | — | 4.7 (25%) |
| 14 | — | 17.3 (85%) | — | — | 10.7 (80%) | 9.0 (39%) | 5.0 (26%) |
| 20 | 11.3 (87%) | 16.7 (82%) | 17.7 (95%) | 12.7 (93%) | 10.7 (80%) | 8.7 (38%) | — |
| 21 | — | — | — | — | — | — | 5.0 (26%) |

Storage Stability Test 3

Cleaning test 3 was carried out using the compositions immediately after preparation and after storage for a predetermined number of days at room temperature (25° C.), and the etch rate of the composition was calculated. The results are shown in Table 8. In Table 8, the values in parentheses following the etch rates represent the retention rate of the etch rate, when the etch rate immediately after preparation (0 days elapsed after preparation) is taken as 100%.

TABLE 8

(etch rate (μm/min), values in parentheses represent a retention rate when an etch rate immediately after preparation (0 days elapsed after preparation) is taken as 100%.)
Cleaning Test 3

| Elapsed days after preparation (days) | Ex. 44 TBAF + NMP/ DPGDME = 0.236/0.764 | Ex. 47 TBAF + NMP/ DPGDME/ DBE = 0.777/0.078/ 0.146 | Ex. 52 TBAF + NEP/ DPGDME/ DBE = 0.653/0.201/ 0.146 | Ex. 55 TBAF + DMI/DPGDME = 0.382/0.618 | Comp. Ex. 11 TBAF + NMP | Comp. Ex. 13 TBAF + MEK | Comp. Ex. 14 TBAF + NMP/n-BuOAc = 0.250/ 0.750 |
|---|---|---|---|---|---|---|---|
| 0 | 21.7 | 15.7 | 21.0 | 18.3 | 10.7 | 36.3 | 19.7 |
| 7 | — | — | — | — | — | — | — |
| 10 | 21.3 (98%) | 15.7 (100%) | — | — | 10.0 (93%) | 23.0 (63%) | — |
| 11 | — | — | 19.0 (90%) | 18.0 (98%) | — | — | 6.3 (32%) |
| 14 | — | — | — | — | — | — | — |
| 20 | 19.7 (91%) | 15.3 (97%) | 19.0 (90%) | 18.0 (98%) | 10.0 (93%) | 15.0 (41%) | — |
| 21 | — | — | — | — | — | — | 5.7 (29%) |

The composition of the present disclosure can be suitably used for applications in which a residue of an adhesive used in a thinning process of a semiconductor wafer, in particular, an adhesive including a polyorganosiloxane compound as an adhesive polymer, on a device wafer is decomposed and cleaned.

The invention claimed is:

1. A composition comprising a quaternary alkylammonium fluoride or a hydrate thereof and an aprotic solvent, the aprotic solvent comprising (A) an N-substituted amide compound having 4 or more carbon atoms and having no active hydrogen on a nitrogen atom, and (B) an ether compound, wherein the content of the aprotic solvent is 70 to 99.99% by mass.

2. The composition according to claim 1, wherein the (A)N-substituted amide compound is a 2-pyrrolidone derivative compound represented by the formula (1):

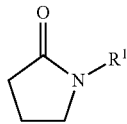

(1)

wherein, in the formula (1), $R^1$ represents an alkyl group having 1 to 4 carbon atoms.

3. The composition according to claim 2, wherein the (A)N-substituted amide compound is a 2-pyrrolidone derivative compound in which $R^1$ is a methyl group or an ethyl group in the formula (1).

4. The composition according to claim 1, wherein the (B) ether compound has a flash point of 21° C. or higher.

5. The composition according to claim 1, wherein the (B) ether compound comprises a dialkyl ether of glycol represented by the formula (2):

$$R^2O(C_nH_{2n}O)_xR^3 \qquad (2),$$

wherein, in the formula (2), $R^2$ and $R^3$ each independently represent an alkyl group selected from the group consisting of a methyl group, an ethyl group, a propyl group, an isopropyl group, an n-butyl group, an isobutyl group, a sec-butyl group, and a t-butyl group, n is 2 or 3, and x is an integer of 1 to 4.

6. The composition according to claim 5, wherein the dialkyl ether of glycol is diethylene glycol dimethyl ether or dipropylene glycol dimethyl ether.

7. The composition according to claim 5, wherein the (B) ether compound further comprises a dialkyl ether represented by the formula (3):

$$R^4OR^5 \qquad (3),$$

wherein, in the formula, $R^4$ and $R^5$ each independently represent an alkyl group having 4 to 8 carbon atoms.

8. The composition according to claim 1, wherein the content of the (A) N-substituted amide compound is 15 to 85% by mass and the content of the (B) ether compound is 85 to 15% by mass, with respect to 100% by mass of the aprotic solvent.

9. The composition according to claim 1, wherein the content of the quaternary alkylammonium fluoride is 0.01 to 10% by mass.

10. The composition according to claim 1, wherein the quaternary alkylammonium fluoride is a tetraalkylammonium fluoride represented by $R^6R^7R^8R^9N^+F^-$, wherein $R^6$ to $R^9$ are each independently an alkyl group selected from the group consisting of a methyl group, an ethyl group, an n-propyl group, an isopropyl group, and an n-butyl group.

11. The composition according to claim 1, which is a decomposing cleaning composition for an adhesive polymer.

12. The composition of claim 11, wherein the adhesive polymer is a polyorganosiloxane compound.

13. A method for cleaning an adhesive polymer on a substrate by using the composition according to claim 1.

14. A method for producing a device wafer comprising cleaning an adhesive polymer on a device wafer by using the composition according to claim 1.

15. A method for regenerating a support wafer comprising cleaning an adhesive polymer on a support wafer by using the composition according to claim 1.

16. The composition according to claim 1, wherein the content of a protic solvent in the composition is 5% by mass or less.

17. The composition according to claim 1, wherein the content of a protic solvent in the composition is 3% by mass or less.

18. The composition according to claim 1, wherein the content of the aprotic solvent is 80 to 99.95% by mass.

19. The composition according to claim 1, wherein the content of the aprotic solvent is 90 to 99.9% by mass.

\* \* \* \* \*